(12) United States Patent
Zarbock et al.

(10) Patent No.: US 8,004,076 B2
(45) Date of Patent: Aug. 23, 2011

(54) MICROELECTRONIC PACKAGE WITH CARBON NANOTUBES INTERCONNECT AND METHOD OF MAKING SAME

(75) Inventors: Edward A. Zarbock, Gilbert, AZ (US); Gloria Alejandra Camacho Bragado, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 289 days.

(21) Appl. No.: 12/242,361

(22) Filed: Sep. 30, 2008

(65) Prior Publication Data

US 2010/0078799 A1    Apr. 1, 2010

(51) Int. Cl.
*H01L 21/00* (2006.01)
(52) U.S. Cl. .................................. 257/690; 438/107
(58) Field of Classification Search .................. None
See application file for complete search history.

(56) References Cited

U.S. PATENT DOCUMENTS

| 6,989,325 B2 * | 1/2006 | Uang et al. ............ 438/613 |
| 2008/0227294 A1 * | 9/2008 | Suh ..................... 438/687 |

FOREIGN PATENT DOCUMENTS

JP    2009049162 A  *  3/2009

* cited by examiner

*Primary Examiner* — Leonardo Andújar
(74) *Attorney, Agent, or Firm* — Winkle, PLLC

(57) ABSTRACT

A method of forming a microelectronic package is provided. The method includes providing a silicon substrate having a plurality of carbon nanotubes disposed on a silicon layer and coupling the silicon substrate to a top surface of a packaging substrate, wherein the plurality of carbon nanotubes are coupled to a plurality of substrate pads of the packaging substrate. The method also includes removing the silicon substrate from the packaging substrate and disposing a die adjacent to the top surface of the packaging substrate, wherein the plurality of carbon nanotubes are coupled to a plurality of bump pads of the die.

18 Claims, 5 Drawing Sheets

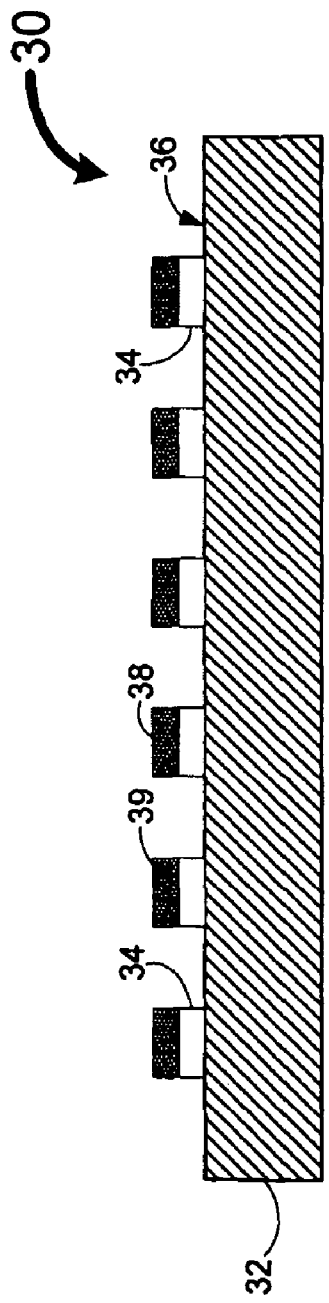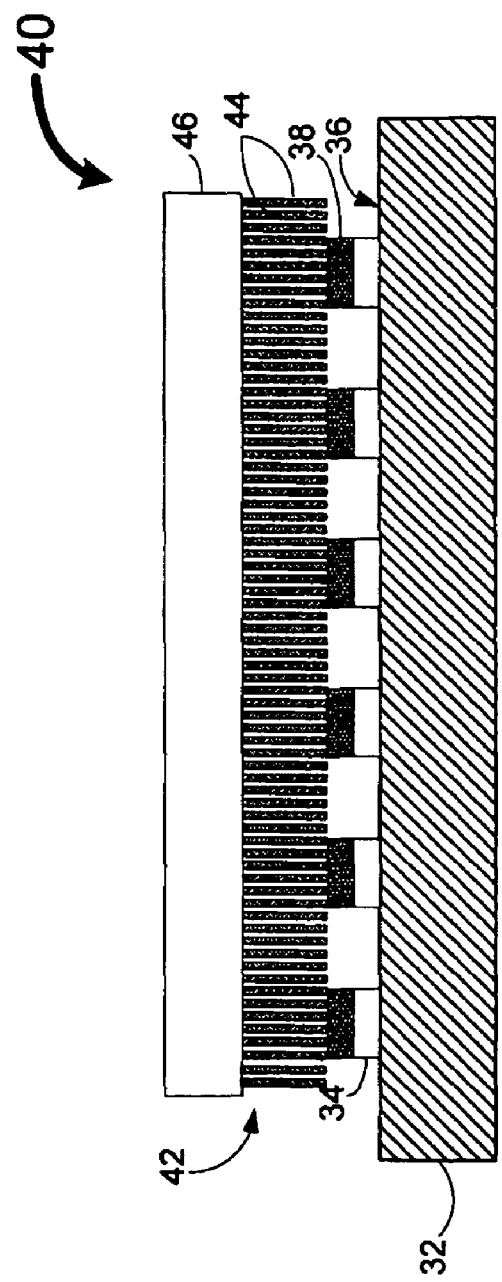

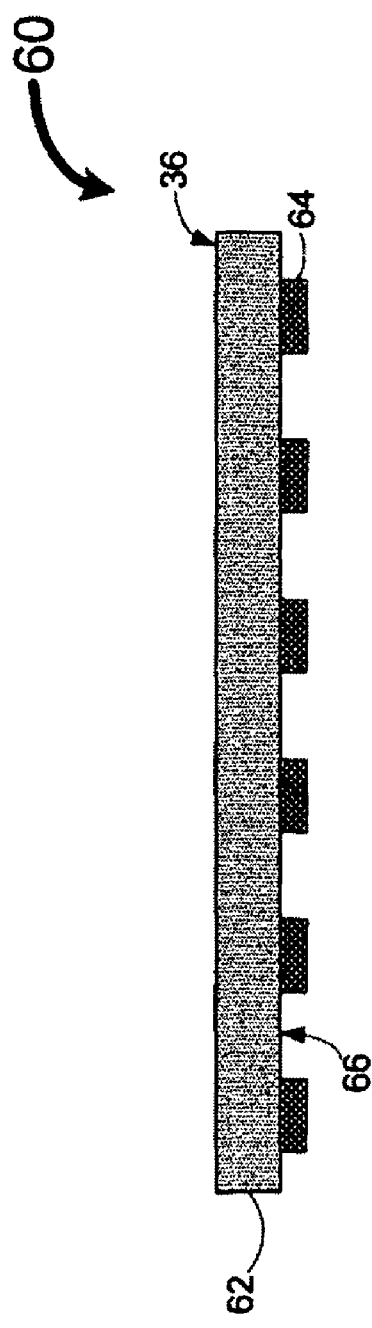

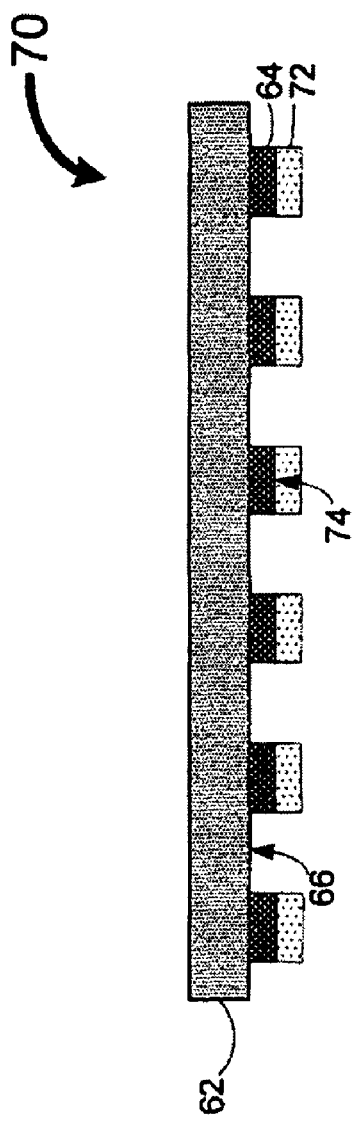
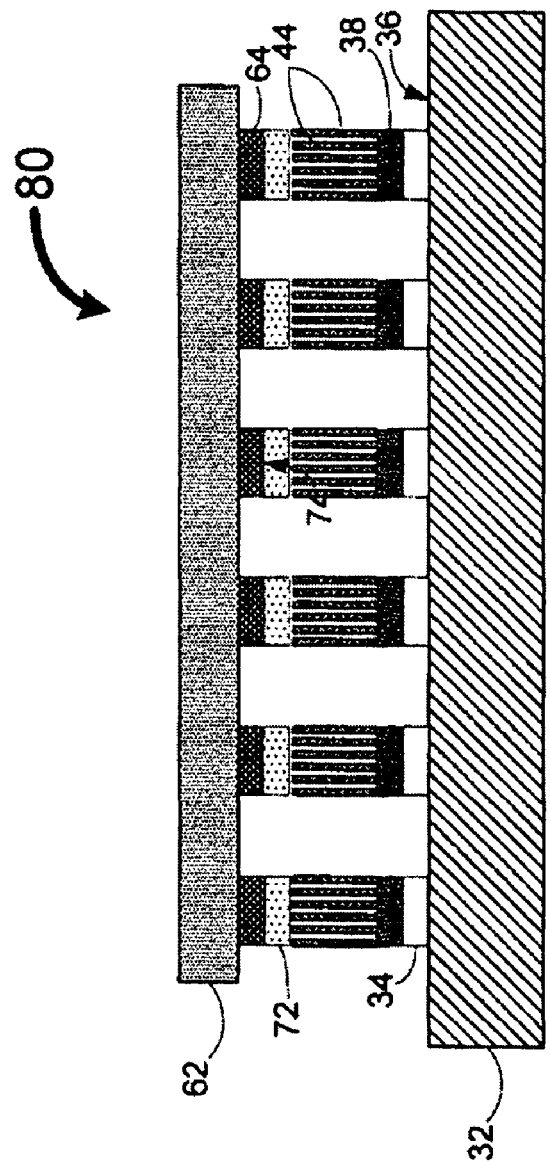

MICROELECTRONIC PACKAGE WITH CARBON NANOTUBES INTERCONNECT AND METHOD OF MAKING SAME

BACKGROUND

With recent advancements in the semiconductor manufacturing technology microelectronic components are becoming smaller and circuitry within such components is becoming increasingly dense. In microelectronic packaging, a semiconductor die is bonded to a packaging substrate through a first level interconnect such as solder joints. Typically, the first level interconnect between the die and the packaging substrate is subjected to significant stress due to coefficient of thermal expansion mismatch between the die and the packaging substrate.

One way of reducing the stresses is by adding carbon nanotubes in the vertical first level interconnect stack. However, integration of carbon nanotubes in the first level interconnect is a challenge due to synthesis of carbon nanotubes at high temperatures that may cause permanent degradation to either the die or the packaging substrate.

BRIEF DESCRIPTION OF THE DRAWINGS

Features of embodiments of the claimed subject matter will become apparent as the following detailed description proceeds, and upon reference to the drawings, in which like numerals depict like parts, and in which:

FIG. 2 illustrates an exemplary configuration of a packaging substrate 32 having a plurality of substrate pads in accordance with embodiments of present technique;

FIG. 3 illustrates an exemplary configuration of a silicon layer coupled to the packaging substrate in accordance with embodiments of present technique;

FIG. 4 illustrates an exemplary configuration of the packaging substrate with the plurality of carbon nanotubes coupled to the respective substrate pads in accordance with embodiments of present technique;

FIG. 5 illustrates an exemplary configuration of a die having a plurality of bump pads in accordance with embodiments of present technique;

FIG. 6 illustrates an exemplary configuration with a solder paste disposed on each of the plurality of bump pads in accordance with embodiments of present technique;

FIG. 7 illustrates an exemplary microelectronic package with the die coupled to the packaging substrate in accordance with embodiments of present technique.

Although the following Detailed Description will proceed with reference being made to illustrative embodiments of the claimed subject matter, many alternatives, modifications, and variations thereof will be apparent to those skilled in the art. Accordingly, it is intended that the claimed subject matter be viewed broadly, and be defined only as set forth in the accompanying claims.

DETAILED DESCRIPTION

As discussed in detail below, the embodiments of the present invention function to provide a microelectronic package with carbon nanotubes as an interconnect between a die and a packaging substrate of the microelectronic package. In particular, the present technique provides a method of attaching carbon nanotubes between the die and the packaging substrate.

References in the specification to "one embodiment", "an embodiment", "an exemplary embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The following description includes terms, such as top, bottom etc. that are used for descriptive purposes only and are not to be construed as limiting. The embodiments of the device or article described herein can be manufactured or used in a number of positions and orientations.

Figure 1:
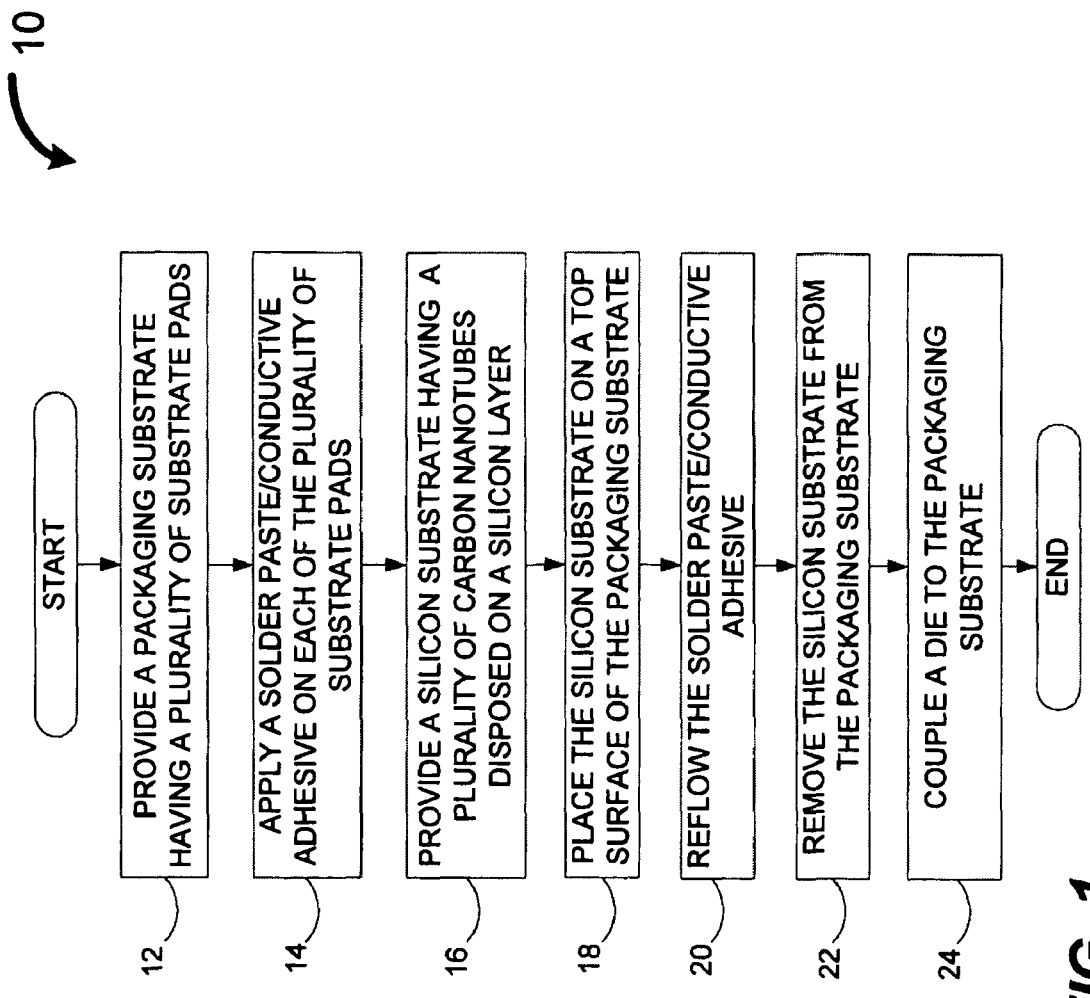
FIG. 1 illustrates an exemplary process for forming the microelectronic package in accordance with embodiments of present technique.

Referring first to FIG. 1, an exemplary process 10 for forming the microelectronic package is illustrated. At block 12, a packaging substrate is provided. The packaging substrate may be formed of a variety of materials including ceramic and printed circuit boards. Further, the packaging substrate may be a one-layer board or a multi-layer board. In this exemplary embodiment, the packaging substrate includes a plurality of substrate pads disposed on a top surface of the packaging substrate. At block 14, a solder paste or a conductive adhesive is applied on a top surface of each of the plurality of substrate pads of the packaging substrate. In certain embodiments, the solder paste may be a low melting point-lead free solder. Examples of the solder include, but are not limited to, tin-silver (SnAg), or tin-silver-copper (SAC), or gold-tin (AuSn), or tin-indium (SnIn), tin-bismuth (SnBi), or combinations thereof. In certain embodiments, the conductive adhesive comprises thermally curable epoxies containing high conductivity particles of metals or alloys, conductive polymers or combinations of thereof. In one exemplary embodiment, the solder paste is screen-printed on each of the plurality of substrate pads.

At block 16, a silicon substrate having a plurality of carbon nanotubes disposed on a silicon oxide layer is provided. In certain embodiments, the plurality of carbon nanotubes may be grown on the silicon layer using thermal or plasma assisted methods. Such methods are known in the art. At block 18, the silicon substrate is placed on a top surface of the packaging substrate. In this exemplary embodiment, the carbon nanotubes disposed on the silicon substrate are facing towards the solder paste or the conductive adhesive on the packaging substrate. The carbon nanotubes contact the solder paste or the conductive adhesive disposed on a corresponding substrate pad. Further, at block 20, one of the solder paste and the conductive adhesive is reflowed/baked and cured to attach the plurality of carbon nanotubes to corresponding substrate pads on the packaging substrate. In one exemplary embodiment, a reflow temperature of the solder paste is between about 170° C. and about 250° C. In one exemplary embodiment, a reflow temperature of the conductive adhesive is between 60° C. and about 180° C.

At block 22, the silicon substrate is removed from the packaging substrate leaving the plurality of nanotubes soldered to the packaging substrate. Further, at block 24, a die having a plurality of bump pads is coupled to the packaging substrate. In certain embodiments, the die forms one of a data storage device, a digital signal processor, a micro-controller and a hand-held device. In this exemplary embodiment, the plurality of nanotubes are coupled to corresponding bump pads of the die.

In one embodiment, a solder paste is applied to a top surface of each of the plurality of bump pads of the die. Further, the solder paste is reflowed to couple the plurality of nanotubes to corresponding bump pads of the die. In one exemplary embodiment, a melting point of the solder paste applied to each of the plurality of bump pads is relatively lesser than a melting point of the solder paste applied to each of the plurality of substrate pads. In one exemplary embodiment, a melting point of the solder paste applied to each of the plurality of bump pads is between about 170° C. and about 250° C.

FIG. 2 illustrates an exemplary configuration 30 of a packaging substrate 32 having a plurality of substrate pads 34. As illustrated, the plurality of substrate pads are disposed on a top surface 36 of the packaging substrate 32. The plurality of substrate pads may be formed on the packaging substrate 32 using known semiconductor fabrication techniques. In this exemplary embodiment, one of a solder paste and a conductive adhesive 38 is applied on a top surface 39 of each of the plurality of substrate pads. In certain embodiments, the solder paste 38 includes tin-silver (SnAg), or tin-silver-copper (SAC), or gold-tin (AuSn), or tin-indium (SnIn), tin-bismuth (SnBi), or combinations thereof. In certain embodiments, the conductive adhesive 38 comprises thermally curable epoxies containing high conductivity particles of metals or alloys, conductive polymers or combinations of thereof. In one exemplary embodiment, a thickness of one of the solder paste and the conductive adhesive 38 is between about 5 microns to about 30 microns.

FIG. 3 illustrates an exemplary configuration 40 of a silicon substrate 42 coupled to the packaging substrate 32. As illustrated, the silicon substrate 42 includes a plurality of carbon nanotubes 44 disposed on a silicon layer 46. In this exemplary embodiment, the silicon substrate 42 is disposed on the solder paste/conductive adhesive 38 disposed on each of the plurality of substrate pads 34. Further, the solder paste/conductive adhesive 38 is reflowed or baked and cured to couple the plurality of carbon nanotubes 44 to corresponding substrate pads 34 of the packaging substrate 32. FIG. 4 illustrates an exemplary configuration 50 of the packaging substrate 32 with the plurality of carbon nanotubes 44 coupled to the respective substrate pads 34. In this exemplary embodiment, the silicon substrate 42 (see FIG. 3) is removed and the plurality of carbon nanotubes 44 are transferred to the packaging substrate 32.

FIG. 5 illustrates an exemplary configuration 60 of a die 62 having a plurality of bump pads 64. As illustrated, the plurality of bump pads 64 are disposed on a bottom surface 66 of the die 62. In this exemplary embodiment, the plurality of bump pads 64 comprises copper pads. In certain embodiments, the die 62 forms one of a data storage device, a digital signal processor, a micro-controller and a hand-held device. FIG. 6 illustrates an exemplary configuration 70 with a solder paste 72 disposed on each of the plurality of bump pads 64. In the illustrated embodiment, the solder paste 72 is applied to a top surface 74 of each of the plurality of bump pads 64. In certain embodiments, the solder paste 72 includes tin-silver (SnAg), or tin-silver-copper (SAC), or gold-tin (AuSn), or combinations thereof.

FIG. 7 illustrates an exemplary microelectronic package 80 with the die 62 coupled to the packaging substrate 32. In this exemplary embodiment, the configurations 50 and 70 of FIGS. 4 and 6 are assembled together to form the microelectronic package 80. The solder paste 72 disposed on each of the plurality of bump pads 64 is reflowed and cured to form the joint between the die 62 and the plurality of carbon nanotubes 44 disposed on the substrate pads 34. In this exemplary embodiment, the plurality of carbon nanotubes 44 are aligned between the substrate pads 34 and corresponding bump pads 64 of the die 62.

In certain embodiments, a melting point of the solder paste 72 disposed on each of the plurality of bump pads 64 is relatively lesser than a melting point of the solder paste 38 disposed on each of the plurality of substrate pads 34. In one exemplary embodiment, the melting point of the solder paste 72 disposed on each of the plurality of bump pads 64 of the die is about 220° C. In one exemplary embodiment, the melting point of the solder paste 38 disposed on each of the plurality of substrate pads 34 is about 280° C. Thus, the embodiments described above provide a technique of placement of carbon nanotubes 44 as interconnects between the die 62 and the substrate 34 of the microelectronic package 80. The process described above facilitates the transfer and subsequent alignment of the carbon nanotubes between the die and the substrate while eliminating any solder bridging issues in the microelectronic package.

Figure 8:
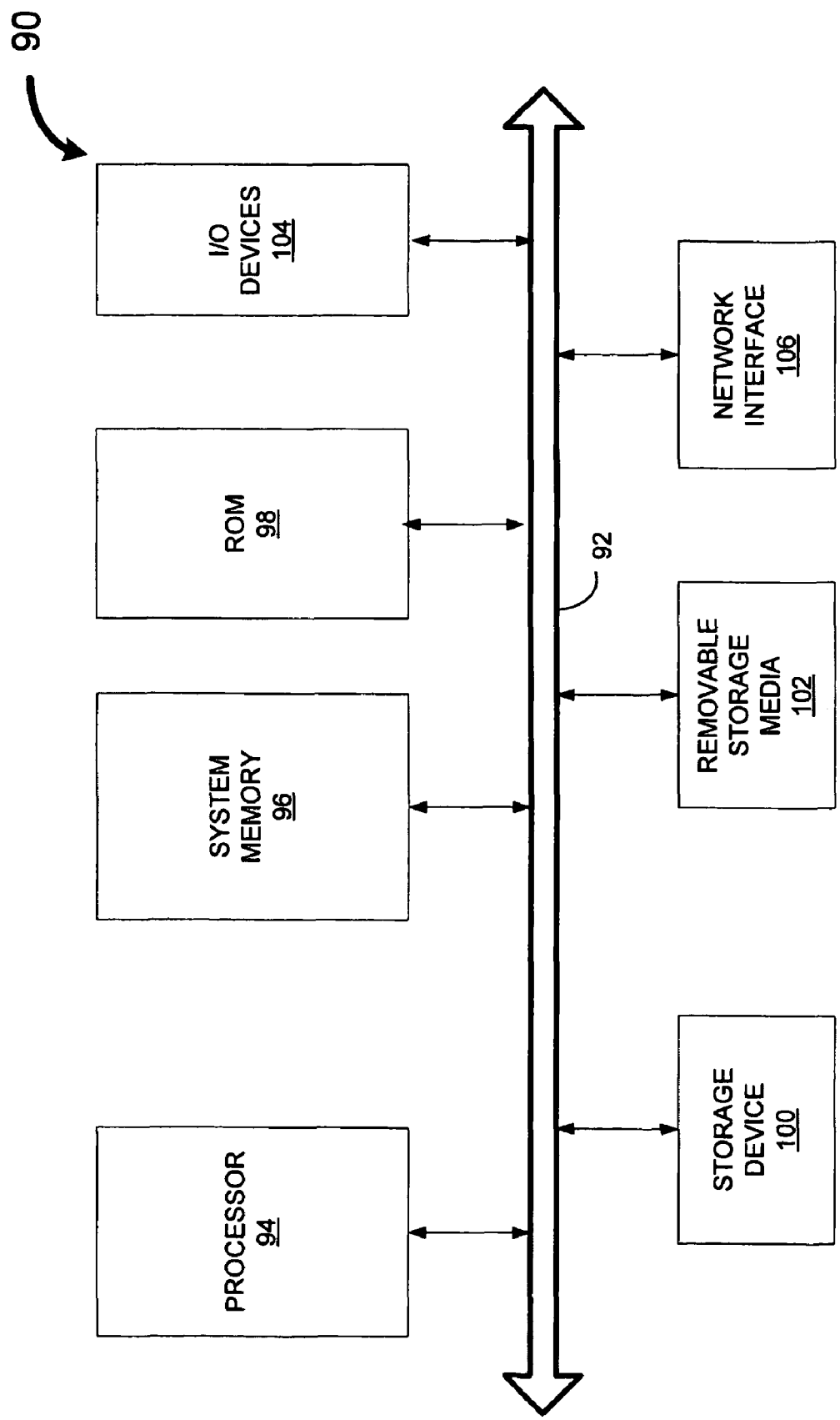
FIG. 8 illustrates an embodiment of a computer system.

The device described above may be disposed in a computer system, a wireless communicator and a hand-held device. FIG. 8 illustrates an embodiment of a computer system 90. The computer system 90 includes a bus 92 to which the various components are coupled. In certain embodiments, the bus 92 includes a collection of a plurality of buses such as a system bus, a Peripheral Component Interface (PCI) bus, a Small Computer System Interface (SCSI) bus, etc. Representation of these buses as a single bus 92 is provided for ease of illustration, and it should be understood that the system 90 is not so limited. Those of ordinary skill in the art will appreciate that the computer system 90 may have any suitable bus architecture and may include any number of combination of buses.

A processor 94 is coupled to the bus 92. The processor 94 may include any suitable processing device or system, including a microprocessor (e.g., a single core or a multi-core processor), a network processor, an application specific integrated circuit (ASIC), or a field programmable gate array (FPGA), or any similar device. It should be noted that although FIG. 6 shows a single processor 94, the computer system 90 may include two or more processors.

The computer system 90 further includes system memory 96 coupled to the bus 92. The system memory 96 may include any suitable type and number of memories, such as static random access memory (SRAM), dynamic random access memory (DRAM), synchronous dynamic random access memory (SDRAM), or double data rate DRAM (DDRDRAM). During operation of the computer system 90, an operating system and other applications may be resident in the system memory 96.

The computer system 90 may further include a read-only memory (ROM) 98 coupled to the bus 92. The ROM 98 may store instructions for the processor 94. The computer system 90 may also include a storage device (or devices) 100 coupled to the bus 92. The storage device 100 includes any suitable non-volatile memory, such as, for example, a hard disk drive. The operating system and other programs may be stored in the storage device 100. Further, a device 102 for accessing removable storage media (e.g., a floppy disk drive or a CD ROM drive) may be coupled to the bus 92.

The computer system 90 may also include one or more Input/Output (I/O) devices 104 coupled to the bus 92. Common input devices include keyboards, pointing devices such as a mouse, as well as other data entry devices. Further, common output devices include video displays, printing devices, and audio output devices. It will be appreciated that these are but a few examples of the types of I/O devices that may be coupled to the computer system 90.

The computer system 90 may further comprise a network interface 106 coupled to the bus 92. The network interface 106 comprises any suitable hardware, software, or combination of hardware and software that is capable of coupling the system 90 with a network (e.g., a network interface card). The network interface 106 may establish a link with the network over any suitable medium (e.g., wireless, copper wire, fiber optic, or a combination thereof) supporting exchange of information via any suitable protocol such as TCP/IP (Transmission Control protocol/Internet Protocol), HTTP (Hyper-Text Transmission Protocol, as well as others.

It should be understood that the computer system 90 illustrated in FIG. 6 is intended to represent an embodiment of such a system and, further, that this system may include any additional components, which have been omitted for clarity and ease of understanding. By way of example, the system 90 may include a direct memory access (DMA) controller, a chip set associated with the processor 94, additional memory (e.g., cache memory) as well as additional signal lines and buses. Also, it should be understood that the computer system 90 may not include all the components shown in FIG. 6. The computer system 90 may comprise any type of computing device, such as a desktop computer, a laptop computer, a server, a hand-held computing device, a wireless communication device, an entertainment system etc.

In this embodiment, the computer system 90 may include the microelectronic package as described in the embodiments above. By way of example, the processor 94 may include a packaging substrate having a plurality of substrate pads disposed on a top surface of the packaging substrate and a silicon substrate coupled to the packaging substrate, wherein the silicon substrate comprises a plurality of carbon nanotubes disposed on a silicon layer. The processor 94 may include a die having a plurality of bump pads disposed on a bottom surface of the die, wherein the silicon substrate is to transfer the plurality of carbon nanotubes to the packaging substrate and wherein the plurality of carbon nanotubes are aligned between the plurality of substrate pads of the packaging substrate and corresponding bump pads of the die.

The foregoing detailed description and accompanying drawings are only illustrative and not restrictive. They have been provided primarily for a clear and comprehensive understanding of the disclosed embodiments and no unnecessary limitations are to be understood therefrom. Numerous additions, deletions, and modifications to the embodiments described herein, as well as alternative arrangements, may be devised by those skilled in the art without departing from the spirit of the disclosed embodiments and the scope of the appended claims.

The invention claimed is:

1. A method of forming a microelectronic package, comprising: providing a silicon substrate having a plurality of carbon nanotubes disposed on a silicon layer; coupling the silicon substrate to a top surface of a packaging substrate, wherein the plurality of carbon nanotubes are coupled to a plurality of substrate pads of the packaging substrate; removing the silicon substrate from the packaging substrate; and
disposing a die adjacent to the top surface of the packaging substrate, wherein the plurality of carbon nanotubes are coupled to a plurality of bump pads of the die.

2. The method of claim 1, wherein coupling the silicon substrate to the top surface of the packaging substrate comprises:
disposing one of a solder paste and a conductive adhesive on a top surface of each of the plurality of substrate pads of the packaging substrate;
disposing the silicon substrate on one of the solder paste and the conductive adhesive on the plurality of substrate pads; and
reflowing the one of the solder paste and the conductive adhesive to attach the plurality of carbon nanotubes to corresponding substrate pads.

3. The method of claim 2, wherein a reflow temperature of the solder paste is between about 170° C. and about 250° C.

4. The method of claim 2, wherein a reflow temperature of the conductive adhesive is between 60° C. and about 180° C.

5. The method of claim 2, wherein the solder paste is screen-printed on each of the plurality of substrate pads.

6. The method of claim 2, wherein the solder paste comprises tin-silver (SnAg), or tin-silver-copper (SAC), or gold-tin (AuSn), or tin-indium (SnIn), tin-bismuth (SnBi), or combinations thereof.

7. The method of claim 2, wherein the conductive adhesive comprises thermally curable epoxies containing high conductivity particles of metals or alloys, conductive polymers or combinations of thereof.

8. The method of claim 1, further comprising:
disposing a solder paste on a top surface of each of the plurality of bump pads of the die; and
aligning the plurality of carbon nanotubes on the packaging substrate with the solder paste on corresponding bump pads of the die.

9. The method of claim 8, further comprising reflowing the solder paste to couple the plurality of carbon nanotubes on the packaging substrate to corresponding bump pads of the die.

10. The method of claim 8, wherein a melting point of the solder paste disposed on the plurality of bump pads of the die is relatively less than a melting point of the solder paste disposed on the plurality of substrate pads.

11. A method of forming a microelectronic package, comprising: applying one of a solder paste and a conductive adhesive on a top surface of a plurality of substrate pads disposed on a packaging substrate;
disposing a silicon substrate on one of the solder paste and the conductive paste, wherein the silicon substrate comprises a plurality of nanotubes grown on a silicon layer;
reflowing the one of the solder paste and the conductive adhesive to attach the plurality of nanotubes to corresponding substrate pads;
removing the silicon substrate from the packaging substrate; and
coupling a die to the packaging substrate, wherein the plurality of nanotubes are coupled to a plurality of bump pads of the die.

12. The method of claim 11, wherein coupling the die to the packaging substrate comprises:
applying a solder paste on a top surface of each of the plurality of bump pads of the die; and
reflowing the solder paste to couple the plurality of nanotubes to corresponding bump pads of the die.

13. The method of claim 11, wherein the solder paste comprises tin-silver (SnAg), or tin-silver-copper (SAC), or gold-tin (AuSn), or tin-indium (SnIn), tin-bismuth (SnBi), or combinations thereof.

14. The method of claim 11, wherein the conductive adhesive comprises thermally curable epoxies containing high conductivity particles of metals or alloys, conductive polymers or combinations of thereof.

15. A method of forming a microelectronic package, comprising:
attaching a plurality of carbon nanotubes to a conductive adhesive disposed on a substrate pad on a printed circuit board;

contacting a copper bump pad of a die with a solder paste; and mating the solder paste on the copper bump pad to the conductive adhesive to achieve a microelectronic package including the die coupled to the substrate pad;

wherein the conductive adhesive is a solder paste, and wherein attaching the plurality of carbon nanotubes to the conductive adhesive includes heating the conductive adhesive to cause the plurality of carbon nanotubes to bond to the conductive adhesive, and to release the plurality of carbon nanotubes from a silicon oxide layer of a substrate.

16. The method of claim 15, further comprising, after mating the solder paste on the copper bump pad, assembling the microelectronic package into a computer system.

17. A method of forming a microelectronic package, comprising:

attaching a plurality of carbon nanotubes to a conductive adhesive disposed on a substrate pad on a printed circuit board;

contacting a copper bump pad of a die with a solder paste; and mating the solder paste on the copper bump pad to the conductive adhesive to achieve a microelectronic package including the die coupled to the substrate pad;

growing the plurality of carbon nanotubes on a silicon oxide layer of a silicon substrate, applying the conductive adhesive to the plurality of carbon nanotubes, wherein the conductive adhesive is a solder paste; and wherein attaching the plurality of carbon nanotubes to the conductive adhesive includes heating the conductive adhesive to cause the plurality of carbon nanotubes to bond to the conductive adhesive, and to release the plurality of carbon nanotubes from a silicon oxide layer of a substrate.

18. The method of claim 17, the method further including:

after mating the solder paste on the copper bump pad, assembling the microelectronic package into a computer system.

* * * * *